United States Patent [19]

Fisher

[11] Patent Number: 4,695,868

[45] Date of Patent: Sep. 22, 1987

[54] PATTERNED METALLIZATION FOR INTEGRATED CIRCUITS

[75] Inventor: Albert W. Fisher, East Amwell Township, Hunterdon County, N.J.

[73] Assignee: RCA Corporation, Princeton, N.J.

[21] Appl. No.: 808,531

[22] Filed: Dec. 13, 1985

[51] Int. Cl.$^4$ ...................... H01L 23/52; H01L 23/54
[52] U.S. Cl. ......................................... 357/68; 357/67
[58] Field of Search .............................. 357/67, 71, 68

[56] References Cited

U.S. PATENT DOCUMENTS

| | | | |
|---|---|---|---|
| 3,260,902 | 7/1966 | Porter | 317/235 |
| 3,436,282 | 10/1966 | Shoda | 148/187 |
| 3,976,512 | 8/1976 | De Nora et al. | 148/1.5 |
| 4,307,131 | 12/1981 | Moutou et al. | 427/84 |
| 4,438,450 | 3/1984 | Sheng et al. | 357/67 |
| 4,467,345 | 8/1984 | Ozawa | 357/68 |
| 4,525,733 | 6/1985 | Losee | 357/65 |
| 4,571,275 | 2/1986 | Moksvold | 148/175 |

Primary Examiner—Andrew J. James
Assistant Examiner—S. V. Clark
Attorney, Agent, or Firm—Allen LeRoy Limberg; R. Hain Swope

[57] ABSTRACT

Large areas of metallization on a semiconductor surface are replaced with an interconnected pattern of metallization. When an area of metallization is covered with a layer of dielectric glass having a thermal coefficient of expansion substantially different from that of the metallization, use of the subject interconnected pattern of metallization significantly enhances the stability of the structure to thermal stress.

4 Claims, 4 Drawing Figures

PATTERNED METALLIZATION FOR INTEGRATED CIRCUITS

This invention relates to the formation of large areas of metallization on an integrated circuit chip. More specifically, this invention provides a means of stabilizing such areas against malfunction resulting from cracking of an overlying passivating or dielectric layer.

BACKGROUND OF THE INVENTION

In the fabrication of electronic devices, it is frequently necessary to provide a patterned layer of metallization, generally aluminum, which functions, for example, as an interconnection among devices on a substrate. Advances in fabrication techniques which have significantly reduced the size of individual devices on a substrate have sharply increased the density and complexity of devices in a given substrate area. The silicon substrate, or chip, has also increased in size to provide additional area for a larger number of devices.

Large integrated circuit chips containing many devices likewise contain an increased number of large areas of metallization such as, for example, bonding pads for circuit connections or metal circuit connector lines in excess of 10 micrometers in width. It is not uncommon for a chip to have forty or more such circuit connections. The package containing the chip must in turn have a like number of external connecting leads to the pads. The package is conventionally made of molded plastic or a ceramic material.

It is common practice to test packaged chips for both functional operation and reliability. Reliability testing generally includes both thermal shock and thermal cycle tests. In the latter, the packages are typically cycled between, e.g. −65° and 150°C. This causes both tensile and compression stresses to be applied to the chip due to mismatches in the thermal coefficient of expansion between the chip and the plastic package. These stresses often produce cracks in the insulating-/passivating layer overlying such large areas of metallization, the chip itself or both. These stresses are particularly evident over a topographical feature on the substrate. During temperature stressing, the plastic package tends to move and to carry the topographical feature along. The stress produced will not affect the feature but may affect a line of metallization overlying it.

In addition to producing cracks in the insulator layer or the chip, these stresses can disturb the internal wire bonded contacts and can actually cause the metal pattern on the chip surface to move by a micrometer or more. Further, in the tightly packed geometry of very-large-scale-integrated circuits where there are overlying layers of metallization, the above-described stresses could cause a break in a glass insulator layer between them, resulting in a metal-to-metal short.

In the event that cracking occurs in the layer of passivating glass overlying a chip, the chip is no longer hermetically sealed. Failure may then occur because of corrosion due to moisture or excessive current leakage due to the presence of alkali metals. Experience has shown that passivation glass layers are most likely to crack where they overlie wide metallization lines such as those frequently found around the periphery of an integrated circuit chip. In accordance with this invention, a means has been found to substantially eliminate the above-described problems.

SUMMARY OF THE INVENTION

Large areas of metallization on a semiconductor substrate are replaced with an interconnected patterned structure having about the same conductivity, thereby providing substantial contact between overlying insulating/passivating layers and the underlying substrate within the area of metallization.

DETAILED DESCRIPTION OF THE INVENTION

Figure 1:
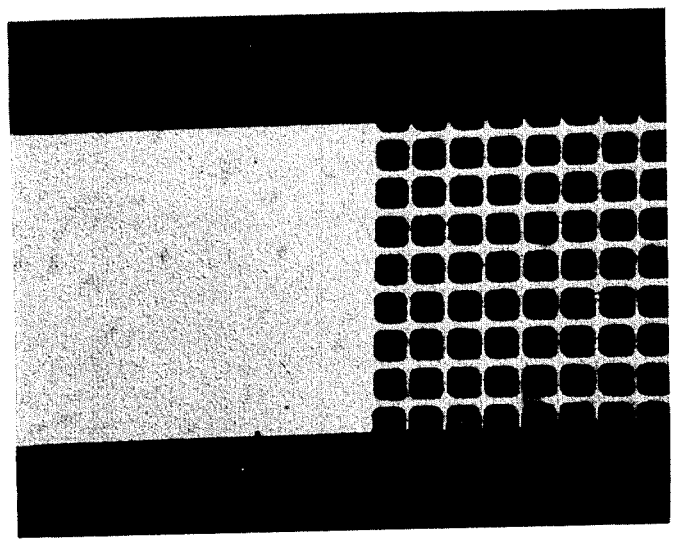
FIGS. 1 through 4 are photomicrographs of a large metal line on a substrate illustrating the positive effect of the interconnected pattern of metallization of this invention.

It will be appreciated that the subject invention is applicable to those areas on a semiconductor substrate, such as a silicon chip, where a large area of metallization, e.g. a wide metal line, directly contacts an insulating or passivating material which has a substantially different thermal coefficient of expansion. Conversely, the present invention is not applicable to large metal bond pads which are bonded to metal connections on a chip.

Although the present invention is applicable to metal structures of any size on a semiconductor substrate, as a practical matter, it is beneficial on metal structures of certain minimum dimensions. Generally, the metal structures to be modified in accordance with this invention are at least about 10 micrometers in their smallest dimension other than thickness, e.g., a 10 micrometer wide line.

In accordance with this invention, large metal areas on a semiconductor substrate are replaced with a interconnected patterned structure, thereby providing substantial contact between the materials underlying and overlying the metal area in openings within the area itself. While a preferred interconnected pattern for metal structures is a grid wherein the metal lines are parallel and intersect at right angles, it is not necessary that the openings in the metal area be uniform in size, shape or spacing. It is preferred that the openings in the metal area be at least about three micrometers at their smallest dimension, or in diameter if they are round, and that the interconnected metal land be not greater than about ten micrometers between the openings. A preferred interconnected metallization pattern in accordance with this invention is a grid of equal lines and openings. It is, of course, necessary that the subject pattern of metallization be an interconnected pattern to provide about the same level of conductivity as the metallization structure that it replaces.

The replacement of large metal areas on a semiconductor substrate with an interconnected pattern of metallization necessitates that the metal area deposited on the substrate be larger than originally required prior to patterning in order to provide about the same level of conductivity. For example, in order to replace a line of metallization 15 micrometers wide with a grid of 5 micrometer lines and openings, the initially deposited line would be 25 micrometers wide. Replacement of a 20 micrometer wide line with a grid of 7 micrometer lines and 5 micrometer openings would require that the initial line be 31 micrometers wide. It will be appreciated that the modification of the preferred grid structure in conformance with the above criteria for openings and metal lands might be necessary in order to accommodate the improved structure in the available area on the surface of a semiconductor substrate. Such modifications are considered to be within the skill of the art.

The semiconductor substrate to be metallized in accordance with this invention may be any suitable material, for example, single crystalline silicon, sapphire, gallium arsenide, polycrystalline materials with suitable surfaces, vitreous materials or the like. A preferred substrate is a single crystalline silicon wafer. The substrate may contain topographical features which are typically devices, silicon islands, circuit components and the like. The exact nature, size or orientation of such features is not critical to the subject invention.

The metallization contemplated herein may be any metal utilized in semiconductor device fabrication. Typical metallization materials include aluminum, an alloy thereof with silicon or silicon and copper, chromium, a titanium/platinum/gold alloy and the like. The metallization may be deposited onto the substrate by any suitable method, for example, by evaporation. The layer of metallization is of any conventional thickness, suitably from about 0.5 to 2.0 micrometers.

The layer of metallization is deposited onto the substrate, patterned as described herein, and then annealed. Annealing may precede patterning of the metallization, or be carried out in conjunction with a subsequent processing operation, e.g. deposition of interlevel dielectric at elevated temperatures. Patterning of the metal layer is carried out by conventional lithographic techniques utilizing conventional resist materials and etchants. Annealing of the metallization may be by heating, laser annealing, pulsed, high intensity, visible light or the like.

Alternatively, the metallization may be deposited onto the substrate in the desired pattern by conventional lithographic techniques, e.g. a multilayer lift-off structure. The lift-off structure is removed and the remaining metallization annealed to the substrate. The replacement of large areas of metal on a semiconductor substrate with an interconnected pattern of metallization in accordance with this invention produces a significant decrease in the cracking of glass overlayers during thermal stress testing of finished devices and, therefore, an increase in product yield. This is because the substrate and the overlying dielectric layer bond in the openings of the subject metallization and prevent a significant shift between the metallization and the overlying dielectric layer. This improvement is realized with a minumum of additional processing and with no loss of operating capacity of the device. The economic benefits to be derived from this invention are therefore significant The following Example further illustrates this invention, it being understood that the invention is in no way intended to be limited to the details described therein. In the Example, all parts and percentages are on a weight basis and all temperatures are in degrees Celsius, unless otherwise stated.

EXAMPLE

A three inch silicon wafer having a one micrometer thick coating of steam grown oxide was utilized as a substrate. The wafer was coated by evaporation with a layer of aluminum to a thickness of 1.3 micrometers.

A layer of the positive photoresist OFPR-800, Dynachem Corp., was coated onto the aluminum layer to a thickness of about one micrometer, irradiated and developed to form a pattern of isolated lines ranging from 5 to 100 micrometers. The photoresist pattern was baked at 125° for 30 minutes. The exposed aluminum was removed by etching in 85 percent phosphoric acid at 50° for about three minutes. The wafer was thoroughly rinsed to remove residual acid, dried and immersed in acetone to remove the remaining photoresist.

The wafer was coated with a 600 nm thick layer of the negative photoresist HNR-999, Phillip A. Hunt Chemical Corp. The resist layer was irradiated and developed to form a pattern of parallel lines of various widths. A grid pattern of 5.7 micrometer lines and 7.0 micrometer spaces on a portion of several 100 micrometer lines was formed. The remaining photoresist was baked at 125° for 30 minutes. The exposed portion of the aluminum layer was removed by dipping the wafers in phosphoric acid as above. The remaining photoresist was removed and a layer of silica glass containing three percent of phosphorus was deposited over the wafer to a thickness of 1.0 micrometer by conventional chemical vapor deposition.

Figure 2:
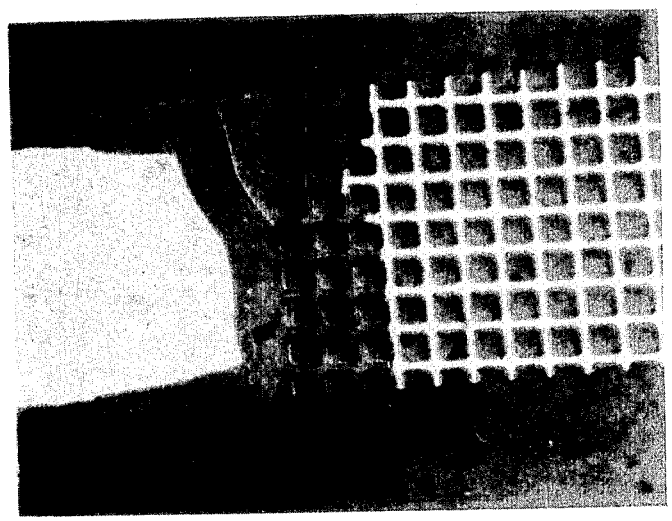

The wafer was subdivided into eight pieces. Two of the pieces were dipped into hot ($\alpha°$) phosphoric acid for 10 minutes. This is a standard method of determining the presence of cracks in the glass layer as the acid will penetrate through a crack and etch away the underlying aluminum. No cracks were found. Two of the remaining pieces were subjected to thermal shock placing them on a hotplate at 525° for one minute. The pieces were then removed from the hot-plate and allowed to cool for 30 seconds. This temperature cycling was repeated fifteen times. The pieces were dipped into hot phosphoric acid for ten minutes. FIG. 1 is a photomicrograph of a representative section of a 100 micrometer wide metallization line on one of the pieces which had not been subjected to showing both the solid line and the grid pattern. FIG. 2 is a photomicrograph of a section of a similar metallization line on a piece which had been subjected to thermal cycling and phosphoric acid dip. The extensive cracking of the glass on the wide portion of the line and at the interface of the line and the grid is clearly evident. There are no cracks on the grid portion of the line.

Figure 3:
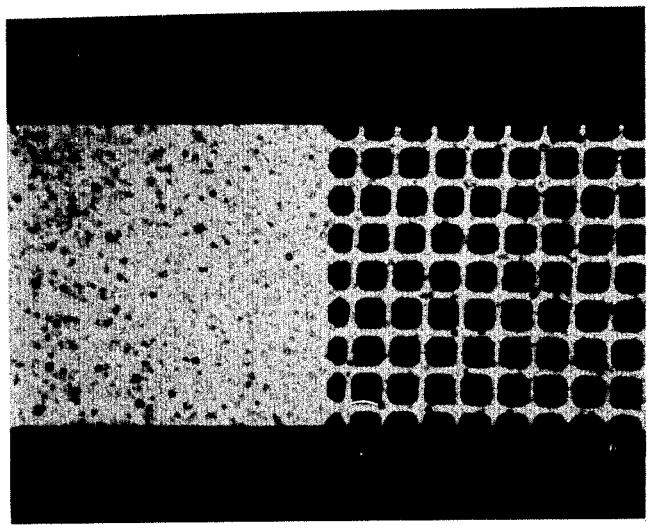
Figure 4:
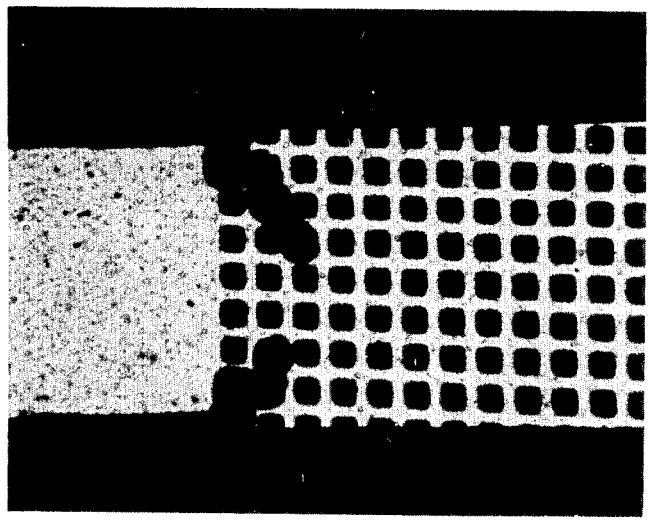

FIGS. 3 and 4 show 100 micrometer lines on other pieces of the same wafer. A portion of each line had been patterned as above to form a grid of 5.2 micrometer linewidth and 7.5×7.5 micrometer openings. In FIG. 3, the line and the grid are shown without thermal cycling. In FIG. 4, the extensive cracking of the phosphosilicate glass overlying the line caused by six thermal cycles is again clearly evident. The cracks at the solid line/grid line interface can be seen to extend from the edge of the solid line into the grid on an angle and then terminate. Otherwise, there is no evidence of cracking of the glass layer overlying the grid. The fact that the cracks terminate a short distance into the grid is indicative of the stabilizing effect of the grid structure.

The metallization pattern also contained an area having parallel lines 18.5, 16, 11.4, 9.3 and 7.0 micrometers wide, respectively. The pieces containing these lines were also thermal cycled through six cycles as above and etched with hot phosphoric acid. The etching revealed cracks only along the 18.5 micrometer wide lines. There was not sufficient stress on any of the other lines to crack the glass. The advantage of metallization in accordance with this invention is clearly demonstrated by this experiment.

I claim:

1. In a structure comprising a semiconductor substrate having thereon an area of metallization at least about 10 micrometers in its smallest dimension other than thickness and a layer of dielectric material overlying said area of metallization, said dielectric material and metallization having substantially differing thermal coefficients of expansion, the improvement wherein said area is replaced with an interconnected patterned area of metallization having about the same conductivity, such that there is substantial direct contact between the substrate and the dielectric material through openings in said patterned area, said openings being at least about three micrometers in their smallest dimension and the metal land between said openings being not greater than about ten micrometers.

2. A structure in accordance with claim 1, wherein the patterned area of metallization is a grid.

3. A structure in accordance with claim 2, wherein the grid consists of 5 micrometer lines and openings.

4. A structure in accordance with claim 1, wherein the metallization is aluminum or an alloy thereof.

* * * * *